(12) United States Patent
Im et al.

(10) Patent No.: US 10,985,441 B2
(45) Date of Patent: Apr. 20, 2021

(54) RADIO FREQUENCY FILTER MODULE

(71) Applicant: Samsung Electro-Mechanics Co., Ltd., Suwon-si (KR)

(72) Inventors: Young Kyoon Im, Suwon-si (KR); Joong Jin Nam, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 52 days.

(21) Appl. No.: 16/507,101

(22) Filed: Jul. 10, 2019

(65) Prior Publication Data
US 2020/0203801 A1 Jun. 25, 2020

(30) Foreign Application Priority Data

Dec. 19, 2018 (KR) .................. 10-2018-0165419

(51) Int. Cl.
*H01Q 1/22* (2006.01)
*H01Q 21/06* (2006.01)
*H04B 1/00* (2006.01)
*H03H 7/12* (2006.01)
*H01Q 1/38* (2006.01)

(52) U.S. Cl.
CPC ......... *H01Q 1/2283* (2013.01); *H01Q 21/065* (2013.01); *H03H 7/12* (2013.01); *H04B 1/0057* (2013.01)

(58) Field of Classification Search
CPC ...... H01Q 1/2283; H01Q 21/065; H01Q 1/38; H01Q 9/0407; H01Q 13/106; H01Q 19/005; H01Q 9/0428; H03H 7/12; H04B 1/0057
See application file for complete search history.

(56) References Cited

U.S. PATENT DOCUMENTS

2011/0210901 A1* 9/2011 Tikka .................. H01Q 1/242
343/853
2011/0248799 A1 10/2011 Yang et al.

FOREIGN PATENT DOCUMENTS

JP 2002-100698 A 4/2002
KR 10-2007-0046420 A 5/2007
KR 10-0714450 B1 5/2007

* cited by examiner

*Primary Examiner* — Wei (Victor) Y Chan
(74) *Attorney, Agent, or Firm* — NSIP Law

(57) ABSTRACT

A radio frequency filter module includes: an antenna package including patch antennas and having first and second frequency passbands different from each other; an integrated circuit (IC) package including an IC; and a connecting member disposed between the antenna package and the IC package, and having a laminated structure configured to electrically connect the patch antennas and the IC to each other. The connecting member includes: a first radio frequency filter pattern having the first and second frequency passbands, and including a first port electrically connected to the IC and a second port electrically connected to at least one of the patch antennas; and a second radio frequency filter pattern having the first and second frequency passbands, and including a third port electrically connected to the IC and a fourth port electrically connected to at least another one of the patch antennas.

19 Claims, 13 Drawing Sheets

RADIO FREQUENCY FILTER MODULE

CROSS-REFERENCE TO RELATED APPLICATIONS

This application claims the benefit under 35 U.S.C. § 119(a) of Korean Patent Application No. 10-2018-0165419 filed on Dec. 19, 2018 in the Korean Intellectual Property Office, the entire disclosure of which is incorporated herein by reference for all purposes.

BACKGROUND

1. Field

The following description relates to a radio frequency filter module.

2. Description of Related Art

Data traffic of mobile communications is increasing rapidly every year. Technological development to support such leap data in real time in wireless network is underway. For example, applications of the contents of Internet of Things (IoT) based data, live VR/AR in combination with augmented reality (AR), virtual reality (VR), and social networking services (SNS), autonomous navigation, a synch view for real-time image transmission from a user's view point using a subminiature camera, and the like, require communications for supporting the exchange of large amounts of data, for example, 5th generation (5G) communications, millimeter wave (mmWave) communications, or the like.

Thus, millimeter wave (mmWave) communications including 5G (5G) communications have been researched, and research into commercialization/standardization of radio frequency modules to smoothly implement such millimeter wave (mmWave) communications have been undertaken.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a radio frequency filter module includes: an antenna package including patch antennas and having first and second frequency passbands different from each other; an integrated circuit (IC) package including an IC; and a connecting member disposed between the antenna package and the IC package, and having a laminated structure configured to electrically connect the patch antennas and the IC to each other. The connecting member includes: a first radio frequency filter pattern having the first and second frequency passbands, and including a first port electrically connected to the IC and a second port electrically connected to at least one of the patch antennas; and a second radio frequency filter pattern having the first and second frequency passbands, and including a third port electrically connected to the IC and a fourth port electrically connected to at least another one of the patch antennas.

The connecting member may further include: a first filter layer in which either one or both of the first and second radio frequency filter patterns is disposed; and a first ground layer disposed between the first filter layer and the antenna package.

The connection member may further include: a second filter layer disposed between the first filter layer and the IC; and a second ground layer disposed between the first filter layer and the second filter layer. A radio frequency filter pattern that is different from a radio frequency filter pattern disposed in the first filter layer, among the first and second radio frequency filter patterns, may be disposed in the second filter layer.

The first radio frequency filter pattern may have a first bandwidth, and the second radio frequency filter pattern may have a second bandwidth that is wider or narrower than the first bandwidth.

The first and second radio frequency filter patterns may be electrically connected to each other in series.

The first radio frequency filter pattern may include: a first ring-shaped pattern including a first portion and a second portion; a first extension pattern extending from the first port in a first direction along the first portion; and a second extension pattern extending from the second port in a direction different from the first direction along the second portion.

The first ring-shaped pattern may further include: third and fourth portions positioned between the first and second portions, respectively, and having a shape detouring inwardly.

A width of each of the third and fourth portions may be greater than a width of each of the first and second portions.

The second radio frequency filter pattern may include: first, second, third, and fourth ring-shaped patterns; a first extension pattern extending from the third port in a first direction along a portion of the first and second ring-shaped patterns; and a second extension pattern extending from the fourth port in a direction different from the first direction along a portion of the third and fourth ring-shaped patterns.

The first, second, third, and fourth ring-shaped patterns may include first, second, third, and fourth inwardly extending portions, respectively. Extension lengths of the first and third inwardly extending portions may be different from extension lengths of the second and fourth inwardly extending portions.

The antenna package may further include: feed vias electrically connecting the patch antennas to the connecting member, respectively; and a coupling structure respectively surrounding the patch antennas. The patch antennas may include: patch antenna patterns electrically connected to the feed vias, respectively; and coupling patch patterns spaced apart from the patch antenna patterns, respectively.

The IC package may further include: a core member surrounding the IC and including a core via; a first electrical connection structure electrically connecting one end of the core via and the connecting member to each other; a second electrical connection structure electrically connected to another end of the core via; and an encapsulant sealing at least a portion of the IC.

The patch antennas may include first and third patch antenna patterns having the first frequency passband, and second and fourth patch antenna patterns having the second frequency passband. The first radio frequency filter pattern may be electrically connected to the first and second patch antenna patterns. The second radio frequency filter pattern may be electrically connected to the third and fourth patch antenna patterns.

In another general aspect, a radio frequency filter module includes: an antenna package including patch antennas; an IC package including an IC; and a connecting member disposed between the antenna package and the IC package, and having a laminated structure configured to electrically connect the patch antennas and the IC to each other. The connecting member includes: a first filter layer in which either one of a first radio frequency filter pattern and a second radio frequency filter pattern is disposed; a first ground layer disposed between the first filter layer and the antenna package; a second filter layer in which another one of the first radio frequency filter pattern and the second radio frequency filter pattern is disposed; and a second ground layer disposed between the first filter layer and the second filter layer. The first radio frequency filter pattern includes: a first ring-shaped pattern including a first portion and a second portion; a first extension pattern extending from a first port electrically connected to the IC, in a first direction, along the first portion; and a second extension pattern extending from a second port electrically connected to at least one of the patch antennas, in a direction different from the first direction, along the second portion.

The first ring-shaped pattern may further include: third and fourth portions located between the first and second portions, respectively, the third and fourth portions each having a width greater than a width of each of the first and second portions.

The third and fourth portions may each have a shape detouring inward.

The first radio frequency filter pattern may have a first bandwidth, and the second radio frequency filter pattern may have a second bandwidth that is wider or narrower than the first bandwidth.

The second radio frequency filter pattern may include: second, third, fourth, and fifth ring-shaped patterns; a third extension pattern extending from the third port in a second direction along a portion of the second and third ring-shaped patterns; and a fourth extension pattern extending from the fourth port in a direction different from the second direction along a portion of the fourth and fifth ring-shaped patterns.

The second, third, fourth and fifth ring-shaped patterns may include second, third, fourth and fifth inwardly extending portions, respectively. The third and fifth inwardly extending portions may have a number of bends that is at least one more than a number of bends in the second and fourth inwardly extending portions.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
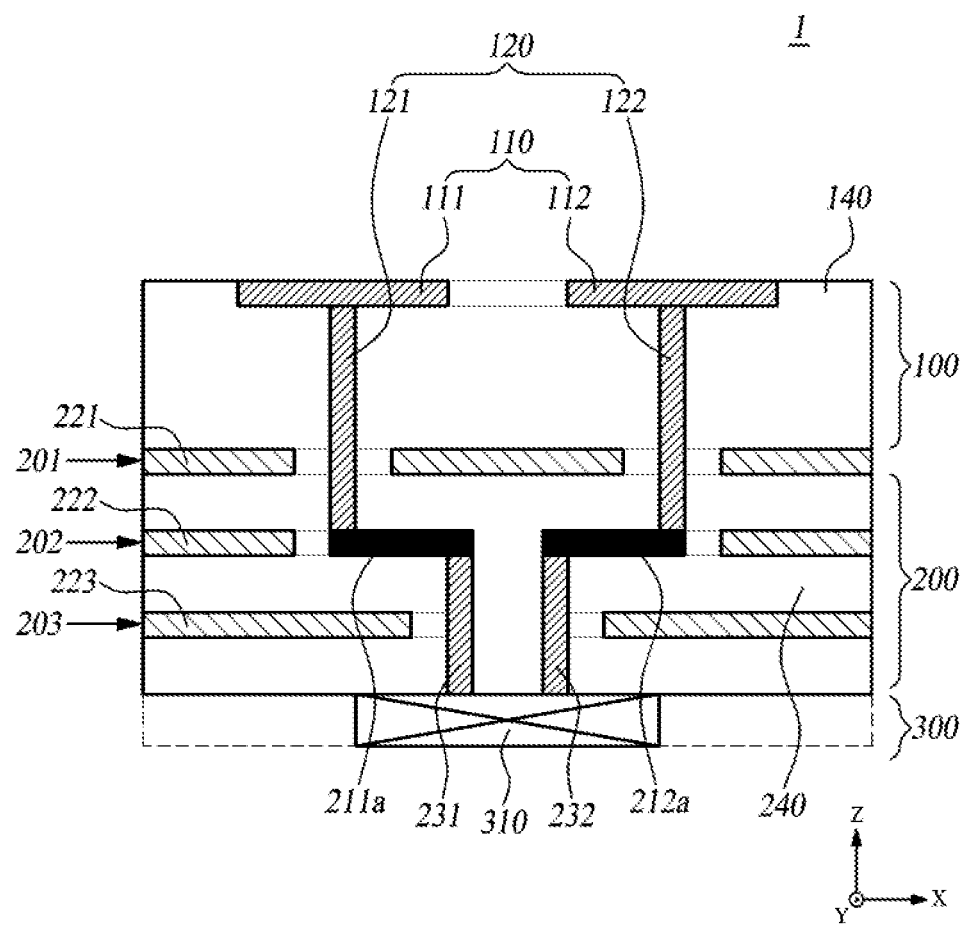
FIG. 1 is a side view of a radio frequency filter module, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In this disclosure, having a frequency passband means having a greatest gain in the center frequency of the frequency passband and having a gain lower than a predetermined gain (e.g., −10 dB) in a frequency band that deviates from the frequency passband. In addition, the gain may be confirmed through the frequency spectrum of an energy ratio (e.g., S-parameter) output to the nth port with respect to an energy input at the nth port, where n is a natural number.

FIG. 1 is a side view of a radio frequency filter module 1, according to an example.

Referring to FIG. 1, the radio frequency filter module 1 includes an antenna package 100, a connecting member 200, and an integrated circuit (IC) package 300.

The antenna package 100 includes patch antennas 110, and may further include a feed via 120 and a dielectric layer 140. The antenna package 100 may be configured to remotely transmit and/or receive a radio frequency (RF) signal. A gain of the antenna package 100 may be improved as the number of the patch antennas 110 included in the antenna package 100 increases.

In addition, the antenna package 100 may have different first and second frequency passbands (e.g., 28 GHz and 39 GHz). For example, the antenna package 100 may be designed some of the patch antennas 110 has a first frequency passband and the others of the patch antennas 110 have a second frequency passband. Alternatively, each of the patch antennas 110 may be designed to have the first and second frequency passbands.

The patch antennas 110 may be designed to have a relatively high transmission efficiency with respect to a frequency band corresponding to the frequency of the RF signal. The patch antennas 110 may include first patch antenna patterns 111 and second patch antenna patterns 112 each having an upper plane and a lower plane. The upper/lower plane may function as an interfacial surface between a conductive medium and air or between dielectric layers 140, through which most of the energy of the RF signal is transmitted.

The feed via 120 may include feed vias 121 and 122 respectively electrically connecting the patch antennas 110 and a connecting member 200 to each other. The number of the feed vias 121 and 122 may correspond to the number of the patch antennas 110. A phase difference between the feed vias 121 and 122 may correspond to a phase difference controlled by an integrated circuit (IC) 310 based on a beamforming scheme. Thus, a constructive interference-to-destructive interference ratio between the patch antennas 110 may be increased, and thus, the antenna package 100 may have further improved gain and directivity.

The dielectric layer 140 may have a higher dielectric constant than the dielectric constant of air and may affect the shape and size of the antenna package 100.

The IC package 300 may include the IC 310.

The IC 310 may generate an RF signal by performing frequency conversion, amplification, filtering, and phase control on a base signal, and may generate a base signal from the RF signal on a similar principle. The base signal has a frequency lower than a frequency of the RF signal, and may have a base band frequency or an intermediate frequency (IF) frequency.

The connecting member 200 is disposed between the antenna package 100 and the IC package 300, and has a laminated structure to electrically connect the patch antennas 110 and the IC 310 to each other. Depending on a lamination structure of the connecting member 200, an electrical length between the patch antenna 110 and the IC 310 may be easily reduced.

Since the RF signal has a relatively high frequency and a relatively short wavelength as compared with a frequency and a wavelength, respectively, of the base signal, the RF signal may be lost more in transmission than in the base signal. Since the electrical length between the antenna package 100 and the IC package 300 may be reduced by the connecting member 200, the loss occurring when the RF signal is transmitted between the IC 310 and the patch antennas 110 may be reduced.

The connecting member 200 may include a first ground layer 201, a first filter layer 202, and a second ground layer 203, and may have a laminated structure in which the first ground layer 201, the first filter layer 202, the second ground layer 203, and an insulating layer 240 are alternately laminated.

The first ground layer 201 may be disposed between the first filter layer 202 and the antenna package 100, and may reflect, in a Z direction, the RF signal transmitted through lower planes of the first and second patch antenna patterns 111 and 112 and through a first ground plane 221. Thus, a gain of the antenna package 100 may be improved, and a negative influence of electromagnetic noise, based on the antenna package 100, on the first filter layer 202 may be reduced.

The second ground layer 203 may be disposed between the first filter layer 202 and the IC 310, and may further improve electromagnetic isolation between the first filter layer 202 and the IC 310 by way of a second ground plane 223.

The first filter layer 202 may include either one or both of first and second radio frequency filter patterns 211a and 212a, and may further include a surrounding ground plane 222 surrounding either one or both of the first and second radio frequency filter patterns 211a and 212a.

The number of the radio frequency filter patterns included in the first filter layer 202 may be increased as the number of the patch antennas 110 increases. For example, the number of the radio frequency filter patterns included in the first filter layer 202 may be further increased depending on the gain and/or directivity of the antenna package 100, and the size of the radio frequency filter module may be increased.

First ends of the first and second radio frequency filter patterns 211a and 212a are electrically connected to the feed vias 121 and 122, respectively, and second ends of the first and second radio frequency filter patterns 211a and 212a are electrically connected to wiring vias 231 and 232, respectively.

The number of the feed vias 121 and 122 and the number of the wiring vias 231 and 232 may increase as the number of the radio frequency filter patterns increases. The first filter layer 202 may have a more complicated structure as the number of the feed vias 121 and 122 and the number of the wiring vias 231 and 232 is increased, and a portion of feed lines between the feed vias 121 and 122 and the wiring vias 231 and 232 may have a bypass shape, and thus, may have a relatively long electrical length.

The first radio frequency filter pattern 211a may have first and second frequency passbands, and the second radio frequency filter pattern 212a may have first and second frequency passbands.

Accordingly, the number of radio frequency filter patterns included in the first filter layer 202 may be reduced by a half. In addition, an increase in size due to improvement in the gain and/or directivity of the antenna package 100 may be suppressed, and a structure of the first filter layer 202 may be easily simplified, thereby reducing an electrical length between the patch antennas 110 and the IC 310, and reducing transmission loss of the RF signal.

Figure 2:
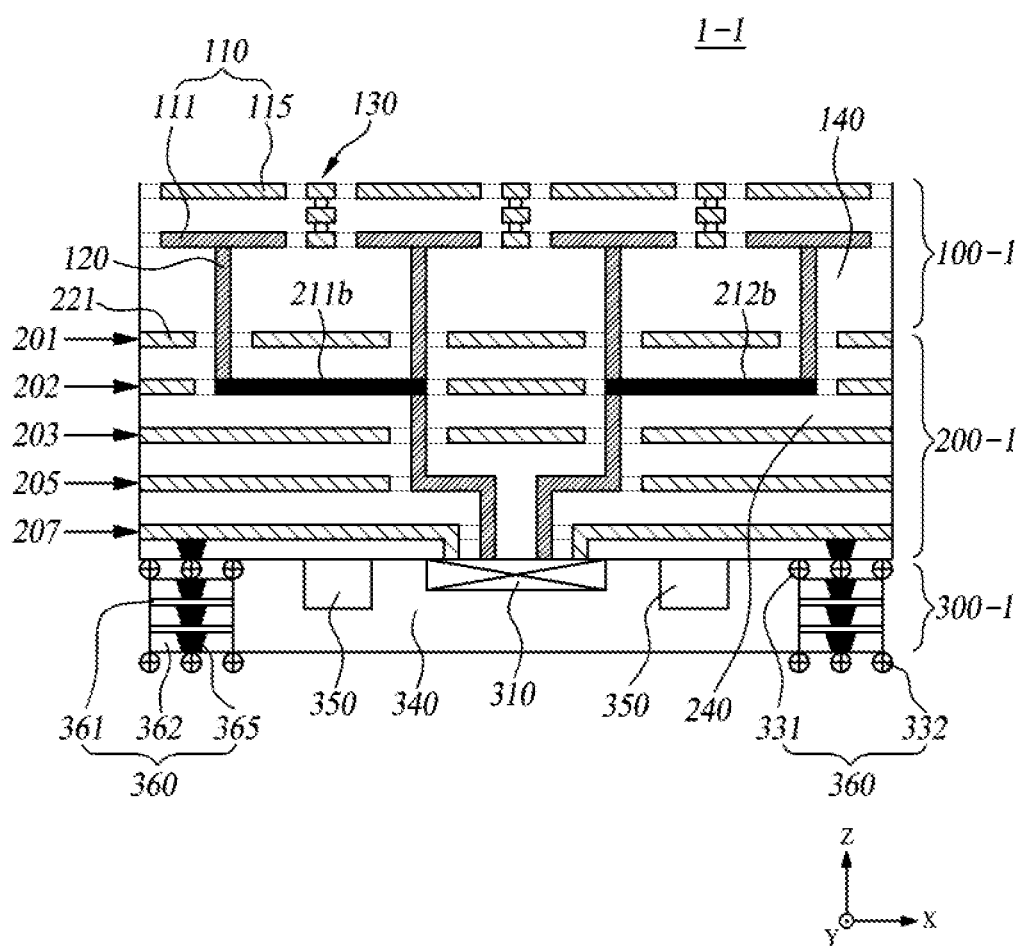
FIG. 2 is a side view of a radio frequency filter module, according to an example.

FIG. 2 is a side view of a radio frequency filter module 1-1, according to an example.

Referring to FIG. 2, in the radio frequency filter module 1-1, an antenna package 100-1 may further include, with respect to the radio frequency filter module 1 of FIG. 1, a coupling structure 130, and the patch antennas 110 may include coupling patch patterns 115.

The coupling structure 130 may surround respective patch antennas 110 and may be electromagnetically coupled to the patch antennas 110 to provide resonance frequency points to the patch antennas 110.

For example, the resonance frequency point may be designed to be significantly different from an intrinsic resonance frequency point of each of the patch antennas 110 (e.g., a plane size, shape, thickness, and the like of the patch antenna). Accordingly, each of the patch antennas 110 may have the first frequency passband based on the intrinsic resonant frequency point, and may have a second frequency passband based on a resonant frequency point based on the coupling structure 130.

For example, the resonance frequency point may be designed similarly to the intrinsic resonance frequency point of each of the patch antennas 110. Accordingly, a bandwidth of each of the patch antennas 110 may be further widened.

For example, the coupling structure 130 may have a structure in which array patterns and array vias are repeatedly arranged, but the disclosure is not limited to this example.

The coupling patch patterns 115 may be disposed above respective patch antenna patterns 111, to be vertically spaced apart from the respective patch antenna patterns 111. Since the coupling patch patterns 115 may also provide resonance frequency points to the patch antennas 110, the bandwidth of the patch antennas 110 may be increased or additional frequency passbands of the patch antennas 110 may be provided.

Depending on the design, each of the patch antennas 110 may be designed to have a single frequency passband. For example, one of the patch antennas 110 may be designed to be relatively small to have a relatively high radio frequency passband, and the other of the patch antennas 110 may be designed to be relatively large to have a relatively low frequency passband. In this case, a first radio frequency filter pattern 211b may be electrically connected to a first patch antenna having a first frequency passband and a second patch antenna having a second frequency passband. The second radio frequency filter pattern 212b may be electrically connected to a third patch antenna having the first frequency passband and a fourth patch antenna having the second frequency passband.

Referring again to FIG. 2, a connecting member 200-1 may further include a feed line layer 205 and an IC support layer 207.

The feed line layer 205 may be disposed between the second ground layer 203 and the IC 310, and may provide a layout space of feed lines. The feed lines may electrically connect the feed via 120 and the IC 310 to each other.

As the feed line layer 205 is separated from the first filter layer 202, the structure of the first filter layer 202 may be further simplified. Accordingly, an overall electrical length from the IC 310 to the patch antennas 110 may be reduced, and transmission loss of the RF signal may be reduced.

The IC support layer 207 may be disposed between the feed line layer 205 and the IC 310, and may provide ground to the IC 310 to improve operational stability of the IC 310, and may provide a path of power supply to the IC 310 and a base signal supply path.

Still referring to FIG. 2, an IC package 300-1 may include an electrical connection structure 330, an encapsulant 340, a passive component 350, and a core member 360.

The electrical connection structure 330 includes a first electrical connection structure 331 electrically connecting the core member 360 and the connecting member 200-1 to each other, and a second electrical connection structure 332 electrically connecting the core member 360 and a set substrate to each other.

For example, the electrical connection structure 330 may have a structure such as a solder ball, a pin, a land or a pad.

The encapsulant 340 may seal at least a portion of the IC 310 and at least a portion of the passive component 350. For example, the encapsulant 340 may be implemented as a Photo Imageable Encapsulant (PIE), an Ajinomoto Build-up Film (ABM), an epoxy molding compound (EMC), or the like.

The passive component 350 is a component that does not receive power/control directly, such as a capacitor or an inductor.

The core member 360 may provide a transmission path for the base signal, and may physically support the radio frequency filter module 1-1.

For example, the core member 360 may include a core wiring layer 361, a core insulating layer 362 and a core via 365, and may be implemented through a Fan-Out Panel Level Package (FOPLP), but the core member 360 is not limited to such an example. In this case, "fan-out" refers to a structure in which an electrical connection path is diverted from the IC 310 in an X direction and/or a Y direction, and the electrical connection path may extend to a position corresponding to the patch antennas 110 and/or the core member 360.

The core wiring layer 361 and the core insulating layer 362 may be alternately laminated. For example, the core wiring layer 361 may be formed using the same material as that of a ground layer of the connecting member 200-1, and the core insulation layer 362 may be formed using the same material as that of the insulation layer 240 of the connecting member 200-1. However, the core wiring layer 361 and the core insulating layer 362 are not limited to the provided examples.

The core via 365 may be electrically connected to the core wiring layer 361, and may be electrically connected to the first and second electrical connection structures 331 and 332. The core via 365 may function as a transmission path for a base signal to be generated in the IC 310 or provided to the IC 310.

Figure 3:
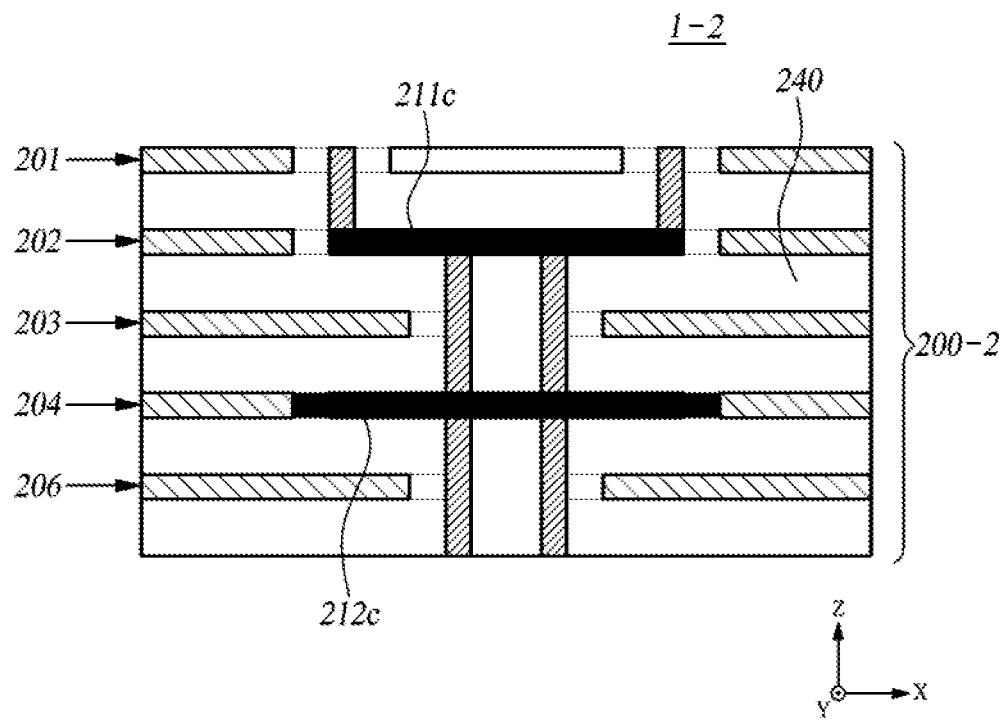
FIG. 3 is a side view illustrating first and second filter layers of a radio frequency filter module, according to an example.

FIG. 3 is a side view illustrating first and second filter layers 202 and 204 of a radio frequency filter module 1-2, according to an example.

Referring to FIG. 3, a connecting member 200-2 of the radio frequency filter module 1-2 may further include, with respect to the connecting member 200 of FIG. 1, a second filter layer 204 and a third ground layer 206.

The second filter layer 204 is disposed between the first filter layer 202 and the IC, and may include a radio frequency filter pattern 212c that is different from a radio frequency filter pattern 211c disposed in the first filter layer.

The first and second radio frequency filter patterns 211c and 212c may each have first and second frequency passbands.

Alternatively, the first radio frequency filter pattern 211c may have a first frequency passband, and the second radio frequency filter pattern 212c may have a second frequency passband.

For example, the first radio frequency filter pattern 211c may be designed to be relatively large to have a relatively low frequency passband, and the second radio frequency filter pattern 212c may be designed to be relatively small to have a relatively high frequency passband. In this case, since the sizes of the first and second radio frequency filter patterns 211c and 212c are different from each other, if the first and second radio frequency filter patterns 211c and 212c are disposed in a single filter layer, the structure of the single filter layer may be relatively more complicated.

Therefore, the first and second radio frequency filter patterns 211c and 212c of the radio frequency filter module 1-2 may be disposed in the first and second filter layers 202 and 204, respectively. Accordingly, the overall structure of the first and second filter layers 202 and 204 may be further simplified. Accordingly, an overall electrical length from the IC 310 to the patch antennas 110 may be reduced, and transmission loss of the RF signal may be reduced.

The second ground layer 203 may be disposed between the first filter layer 202 and the second filter layer 204. Thus, the degree of electromagnetic isolation between the first filter layer 202 and the second filter layer 204 may be improved.

The third ground layer 206 may be disposed between the second filter layer 204 and the IC. Thus, the electromagnetic degree of isolation between the second filter layer 204 and the IC may be improved.

A vertical relationship between the feed line layer and the third ground layer 206 illustrated in FIGS. 2 and 3 is not particularly limited.

FIGS. 4A to 4D are block diagrams illustrating connection relationships among blocks of a radio frequency filter module, according to an example.

Figure 4A:
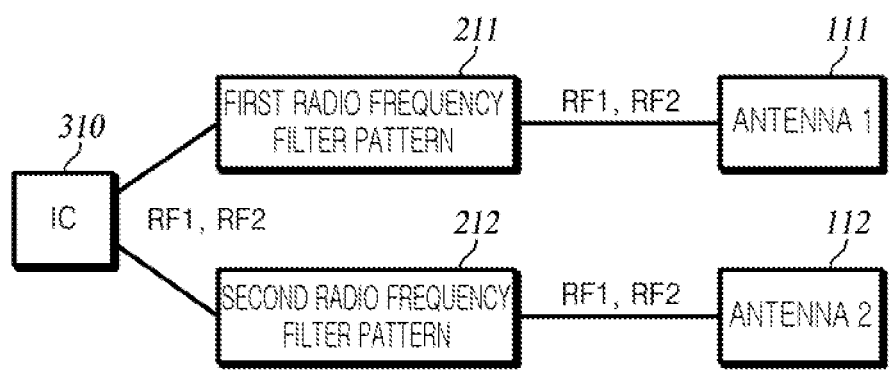
FIGS. 4A to 4D are block diagrams illustrating connection relationships among blocks of a radio frequency filter module, according to examples.
Figure 4B:
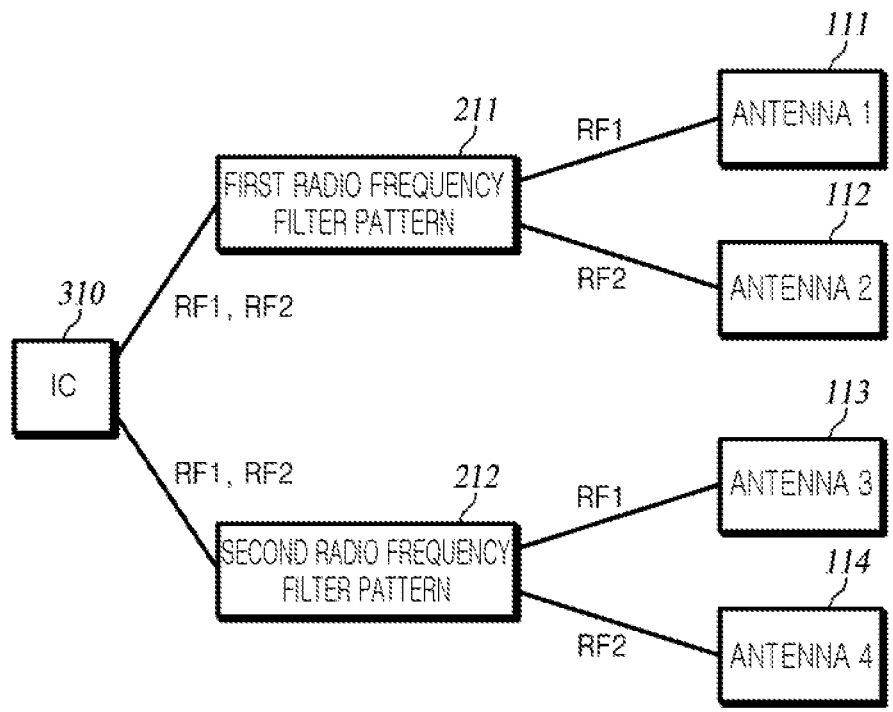

Referring to FIGS. 4A and 4B, a first radio frequency filter pattern 211 may transmit and receive a first RF signal RF1 of a first frequency and a second RF signal RF2 of a second frequency to and from the IC 310, and a second radio frequency filter pattern 212 may transmit and receive the first RF signal RF1 of the first frequency and the second RF signal RF2 of the second frequency to and from the IC 310.

The radio frequency filter module illustrated in FIG. 4A may correspond to the radio frequency filter module 1 illustrated in FIG. 1.

Referring to FIG. 4A, the first radio frequency filter pattern 211 may transmit and receive the first and second RF signals RF1 and RF2, to and from the first patch antenna pattern 111. The second radio frequency filter pattern 212 may transmit and receive the first and second RF signals RF1 and RF2, to and from the second radio frequency filter pattern 212.

The radio frequency filter module illustrated in FIG. 4B may correspond to the radio frequency filter module 1-1 illustrated in FIG. 2.

Referring to FIG. 4B, the first radio frequency filter pattern 211 may transmit and receive the first RF signal RF1 to and from the first patch antenna pattern 111, and may transmit and receive the second RF signal RF2 to and from the second patch antenna pattern 112. Further, the second radio frequency filter pattern 212 may transmit and receive the first RF signal RF1 to and from a third patch antenna pattern 113, and may transmit and receive the second RF signal RF2 to and from a fourth patch antenna pattern 114.

Figure 4C:
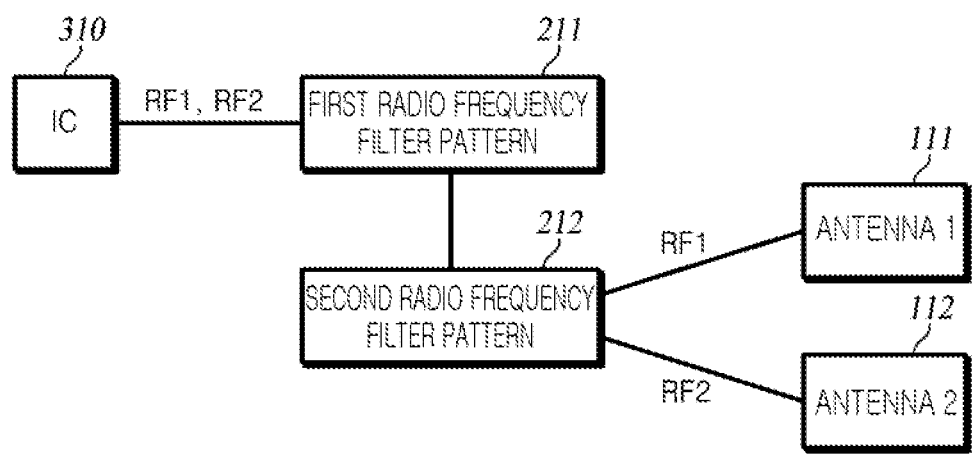

Referring to FIG. 4C, the first and second radio frequency filter patterns 211 and 212 may be connected to each other in series. For example, the first and second RF signals RF1 and RF2 may be filtered twice or more through the first and second radio frequency filter patterns 211 and 212, respectively.

Figure 4D:
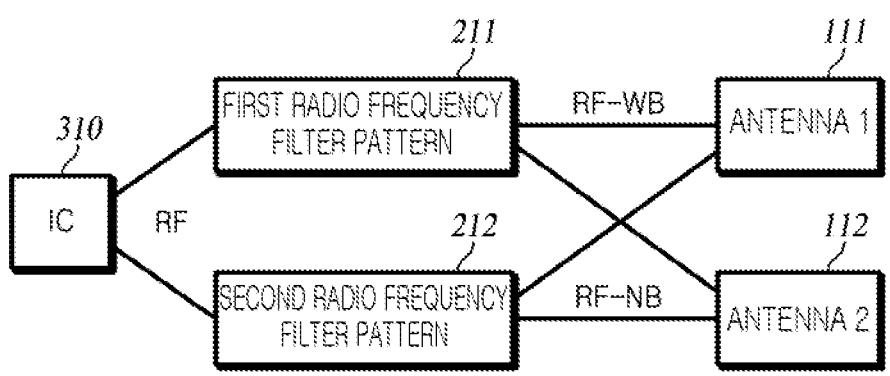

Referring to FIG. 4D, the first radio frequency filter pattern 211 may have a first bandwidth (for example, 3 GHz), and an RF signal RF-WB having been filtered by the first bandwidth may pass between the first radio frequency filter pattern 211 and the first and second patch antenna patterns 111 and 112.

The second radio frequency filter pattern 212 may have a second bandwidth (e.g., 850 MHz) that is wider or narrower than the first bandwidth, and an RF signal RF-NB having been filtered by the second bandwidth may pass between the second radio frequency filter pattern 212 and the first and second patch antenna patterns 111 and 112.

In the case in which the first and second radio frequency filter patterns 211 and 212 have different widths of bandwidths, since the radio frequency filter module may provide more adaptive filtering according to various communications standards, harmonics mixed in the RF signal transmitted and received remotely may be further significantly reduced.

Figure 5A:
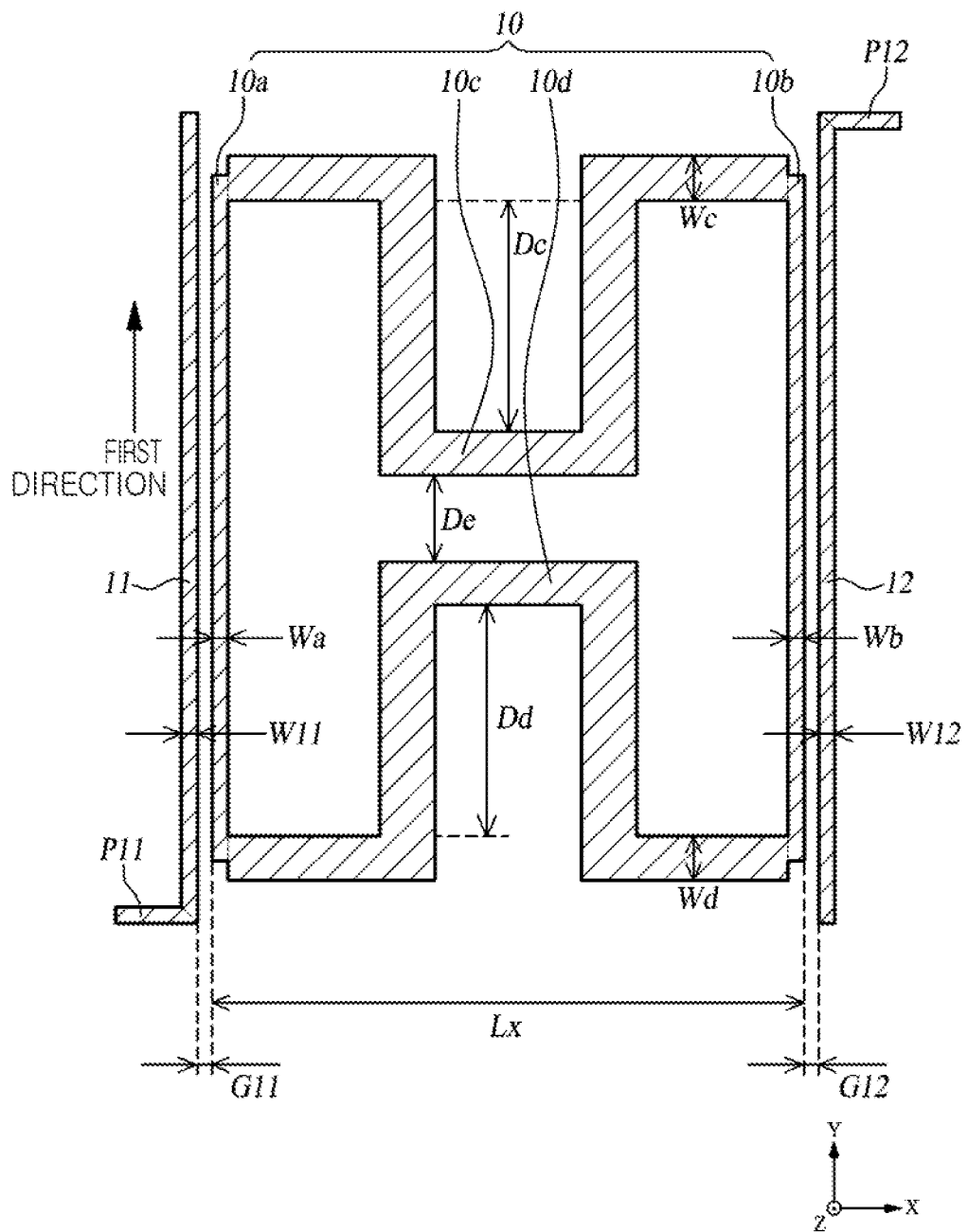
FIG. 5A is a plan view illustrating a first radio frequency filter pattern of a radio frequency filter module, according to an example.

FIG. 5A is a plan view illustrating an example of a first radio frequency filter pattern 211d of a radio frequency filter module, according to an example.

Referring to FIG. 5A, the first radio frequency filter pattern 211d includes a first port P11 electrically connected to an IC, and a second port P12 electrically connected to at least one patch antenna among patch antennas.

The first radio frequency filter pattern 211d may include a first ring-shaped pattern 10, a first extension pattern 11, and a second extension pattern 12.

The first extension pattern 11 may have a shape extending from the first port P11 in a first direction and may be disposed adjacent to the first ring-shaped pattern 10. The first extension pattern 11 may be disposed adjacent to a first side of the ring-shaped pattern 10.

The second extension pattern 12 may have a shape extending from the 1 second port P12 in a direction different from the first direction (e.g., a direction opposite to the first direction), and may be disposed adjacent to the first ring-shaped pattern 10. The second extension pattern 12 may be disposed adjacent to a second side of the ring-shaped pattern 10 that is opposite the first side of the ring-shaped pattern.

The first ring-shaped pattern 10 may act as an inductor, and electromagnetic coupling between the first ring-shaped pattern 10 and the first extension pattern 11 and the second extension pattern 12 may act as a capacitor.

The RF signal input through the first port P11 may pass through a first path in a clockwise direction and a second path in a counterclockwise direction, in the first ring-shaped pattern 10.

In this case, the combination of inductance/capacitance applied to the first path and the combination of the inductance/capacitance applied to the second path may be different from each other.

A first frequency may be approximate to matching an impedance of a transmission line in the first path, and a second frequency may be approximate to matching an impedance of the transmission line in the second path.

Therefore, the RF signal of the first frequency may easily pass through the first path, the RF signal of the second frequency may easily pass through the second path, and energy of the remaining frequency may be blocked. For example, the first radio frequency filter pattern 211d may provide a plurality of frequency passbands.

Still referring to FIG. 5A, the first ring-shaped pattern 10 may include first, second, third and fourth portions 10a, 10b, 10c and 10d.

The first portion 10a may be adjacent to the first extension pattern 11 at a first interval or spacing G11, and the second portion 10b may be adjacent to the second extension pattern 12 at a second interval or spacing G11.

The third and fourth portions 10c and 10d may be respectively located between the first and second portions 10a and 10b, and may have a shape detouring or protruding inwardly. More specifically, the third and fourth portions 10c and 10d may include inwardly extending portions. In this case, 'inward(ly)' refers to directions facing each other in the third and fourth portions 10c and 10d.

A length Lx of the first ring-shaped pattern 10 in the X direction may correspond to a length of the third and fourth portions 10c and 10d, and the length of the third and fourth portions 10c and 10d may correspond to inductance.

The third and fourth portions 10c and 10d may increase inductance without increasing the length Lx of the first ring-shaped pattern 10 in the X direction depending on the detour or extension shape of the third and fourth portions 10c and 10d.

For example, when the third and fourth portions 10c and 10d bypass by third and fourth bypass lengths Dc and Dd, respectively, a length of each of the third and fourth portions 10c and 10d may be increased by twice that of each of third and fourth bypass lengths Dc and Dd. Therefore, the third and fourth portions 10c and 10d may increase the inductance by an amount corresponding to twice the third and fourth bypass lengths Dc and Dd, respectively. The third and fourth bypass lengths Dc and Dd are measured in a detour or extension direction of the inwardly extending portions of the third and fourth portions 10c and 10d, respectively. In addition, the third and fourth portions 10c and 10d may respectively have additional inductance according to a magnetic field concentration effect according to the bypass mode.

A distance De between the third and fourth portions 10c and 10d is not particularly limited. The distance De is, for example a minimum distance between the inwardly extending portions of the third and fourth portions 10c and 10d.

For example, widths Wc and Wd of the third and fourth portions 10c and 10d may be wider than widths Wa and Wb of the first and second portions 10a and 10b, respectively.

Accordingly, the first radio frequency filter pattern 211d may have a finely adjusted capacitance according to relatively narrow widths of the first and second portions 10a and 10b. The first radio frequency filter pattern 211d may also have a relatively reduced resistance due to relatively wide widths of the third and fourth portions 10c and 10d, thereby reducing insertion loss of the first radio frequency filter pattern 211d.

For example, the respective widths Wc and Wd of the third and fourth portions 10c and 10d may be wider than a width W11 of the first extension pattern 11 or a width W12 of the second extension pattern 12.

Figure 5B:
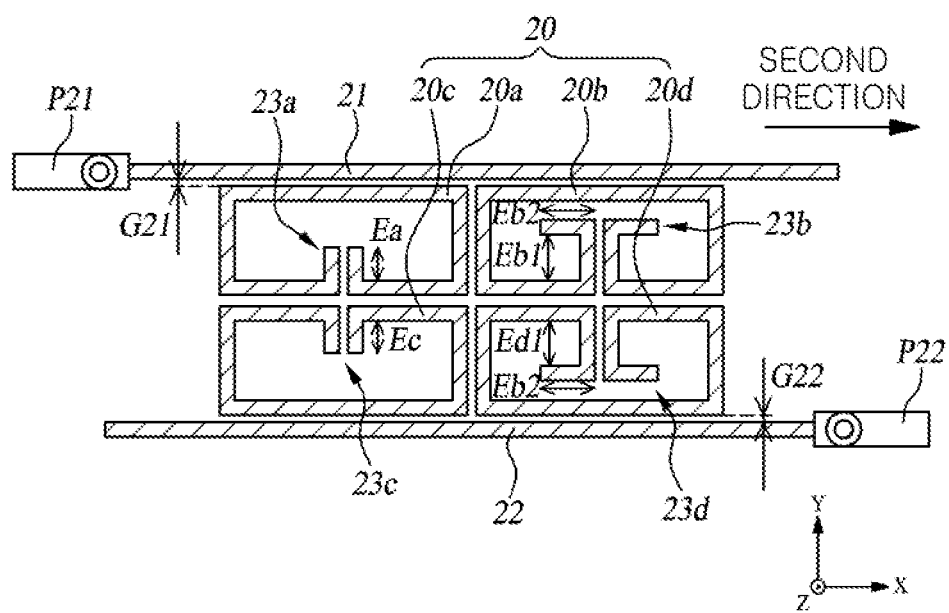
FIG. 5B is a plan view illustrating a second radio frequency filter pattern of a radio frequency filter module, according to an example.

FIG. 5B is a plan view illustrating the form of a second radio frequency filter pattern 212d of a radio frequency filter module, according to an example.

Referring to FIG. 5B, the second radio frequency filter pattern 212d may include a third port P21 electrically connected to an IC, and a fourth port P22 electrically connected to at least one patch antenna among patch antennas.

The second radio frequency filter pattern 212d may include ring-shaped patterns 20, a third extension pattern 21, and a fourth extension pattern 22.

The third extension pattern 21 may have a shape extending from the third port P21 in a second direction, and may be disposed adjacent to the ring-shaped patterns 20.

The fourth extension pattern 22 may have a shape extending from the fourth port P22 in a direction different from the second direction (e.g., a direction opposite to the second direction), and may be disposed adjacent to the ring-shaped patterns 20.

The ring-shaped patterns 20 may act as inductors, and electromagnetic coupling between the ring-shaped patterns 20 and the third extension pattern 21 and the fourth extension pattern 22 may act as a capacitor.

An RF signal input through the third port P21 may pass through a third path, passing in a clockwise direction, and a fourth path passing in a counterclockwise direction, in the ring-shaped patterns 20. In this case, the combination of inductance/capacitance applied to the third path and the combination of inductance/capacitance applied to the fourth path may be different from each other.

The first frequency may be approximate to matching an impedance of a transmission line in the third path, and the second frequency may be approximate to matching an impedance of a transmission line in the fourth path.

Therefore, the RF signal of the first frequency may easily pass through the third path, the RF signal of the second frequency may easily pass through the fourth path, and energy of the remaining frequency may be blocked. For example, the second radio frequency filter pattern 212d may provide a plurality of frequency passbands.

Still referring to FIG. 5B, the ring-shaped patterns 20 may include second, third, fourth and fifth ring-shaped patterns 20a, 20b, 20c and 20d.

The second and third ring-shaped patterns 20a and 20b may be adjacent to the third extension pattern 21 at a third interval or spacing G21, and the fourth and fifth ring-shaped patterns 20c and 20d may be adjacent to the fourth extension pattern 22 at a fourth interval or spacing G22.

The second, third, fourth and fifth ring-shaped patterns 20a, 20b, 20c and 20d may include second, third, fourth and fifth inwardly extending portions 23a, 23b, 23c and 23d, respectively.

Respective extension lengths Ea and Ec of the second and fourth inward extending portions 23a and 23c may be different from respective extension lengths Eb1+Eb2 and Ed1+Ed2 of the third and fifth inward extending portions 23b and 23d.

Accordingly, the second radio frequency filter pattern 212d may have an impedance of the third path and an impedance of the fourth path, which are easily adjusted without increasing the size of the radio frequency filter module.

In addition, the third and fifth inward extending portions 23b and 23d may have a form bent at least once more than the second and fourth inward extending portions 23a and 23c. Accordingly, the second radio frequency filter pattern 212d may have an impedance of the third path and an impedance of the fourth path, which are relatively easily adjusted without increasing the size of the radio frequency filter module.

Figure 5C:
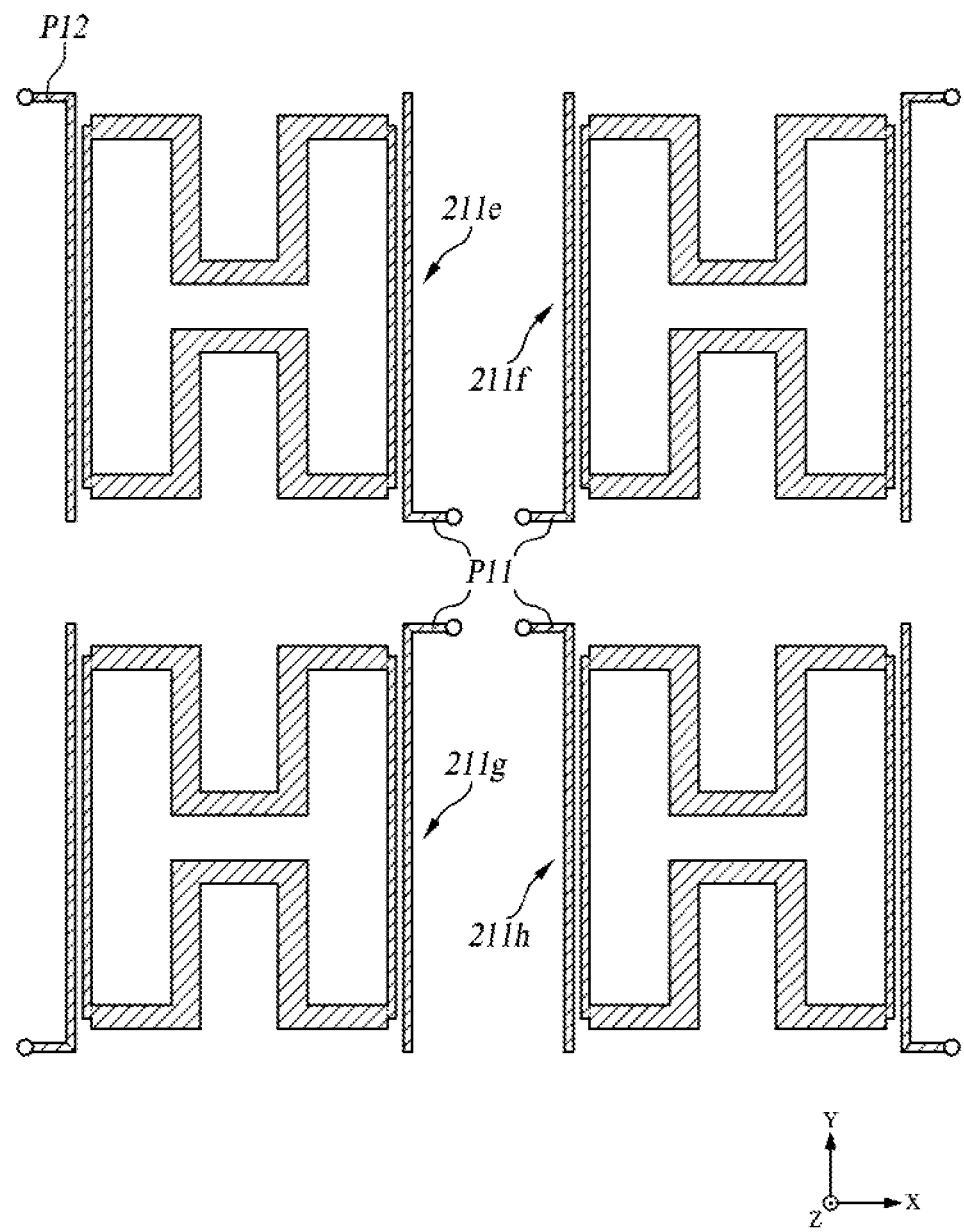
FIG. 5C is a plan view illustrating an array form of a first radio frequency filter pattern of a radio frequency filter module, according to an example.

FIG. 5C is a plan view illustrating an array form of first radio frequency filter patterns 11e, 211f, 211g and 211h, according to an example.

Referring to FIG. 5C, the first radio frequency filter patterns 211e, 211f, 211g, and 211h may respectively have a shape similar to that of the first radio frequency filter pattern illustrated in FIG. 5A, and may respectively include a first port P11 disposed in a concentrated manner and a second port P12 disposed in a distributed manner. That is, the first ports P11 of the first radio frequency filter patterns 211e, 211f, 211g, and 211h may be disposed relatively close together, and the second ports P12 of the first radio frequency filter patterns 211e, 211f, 211g, and 211h may be disposed relatively far apart from one another.

The concentrated arrangement of the first port P11 may reduce an electrical length between the IC and the first radio frequency filter patterns 211e, 211f, 211g, and 211h, and the distributed arrangement of the second port P12 may reduce an electrical length between the first radio frequency filter patterns 211e, 211f, 211g, and 211h and the patch antenna patterns. Thus, transmission loss of the RF signal from the IC to the patch antenna patterns may be reduced.

In this case, each of the first radio frequency filter patterns 211e, 211f, 211g, and 211h may each have both first and second frequency passbands.

Figure 5D:
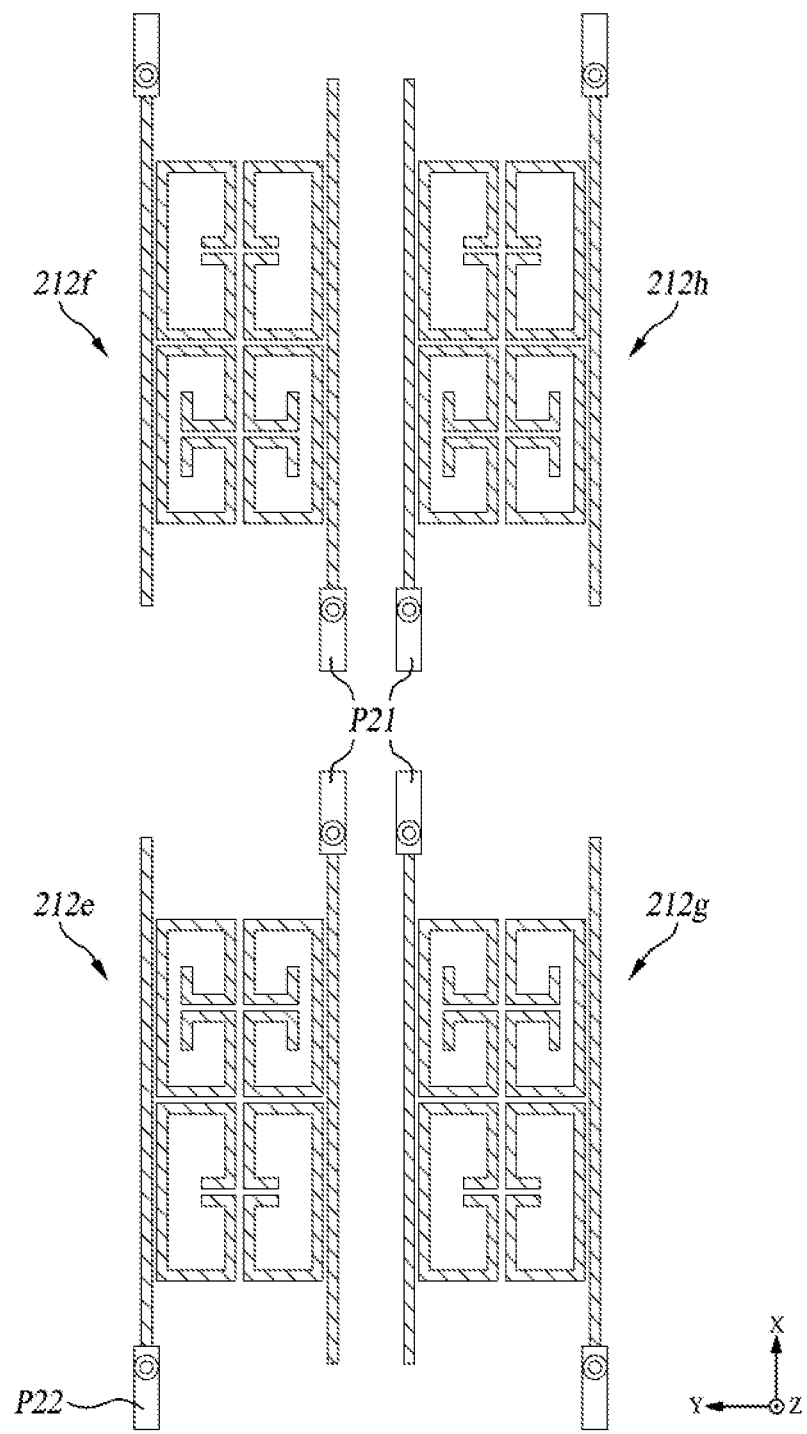
FIG. 5D is a plan view illustrating an array form of a second radio frequency filter pattern of the radio frequency filter module, according to an example.

FIG. 5D is a plan view illustrating an array form of second radio frequency filter patterns 212e, 212f, 212g, and 212h of a radio frequency filter module, according to an example.

Referring to FIG. 5D, second radio frequency filter patterns 212e, 212f, 212g, and 212h may respectively have a shape similar to that of the second radio frequency filter pattern 212d illustrated in FIG. 5B, and may respectively include a third port P21 disposed in a concentrated manner and a fourth port P22 disposed in a distributed manner. That is, the third ports P21 of the second radio frequency filter patterns 212e, 212f, 212g, and 212h may be disposed relatively close together, and the fourth ports P22 of the second radio frequency filter patterns 212e, 212f, 212g, and 212h may be disposed relatively far apart from one another.

The concentrated arrangement of the third port P21 may reduce an electrical length between the IC and the second radio frequency filter patterns 212e, 212f, 212g, and 212h, and the distributed arrangement of the fourth port P22 may reduce an electrical length between the second radio frequency filter patterns 212e, 212f, 212g, and 212h and the patch antenna patterns. Thus, transmission loss of the RF signal from the IC to the patch antenna patterns may be reduced.

In this case, each of the second radio frequency filter patterns 212e, 212f, 212g, and 212h may have both the first and second frequency passbands.

Figure 6A:
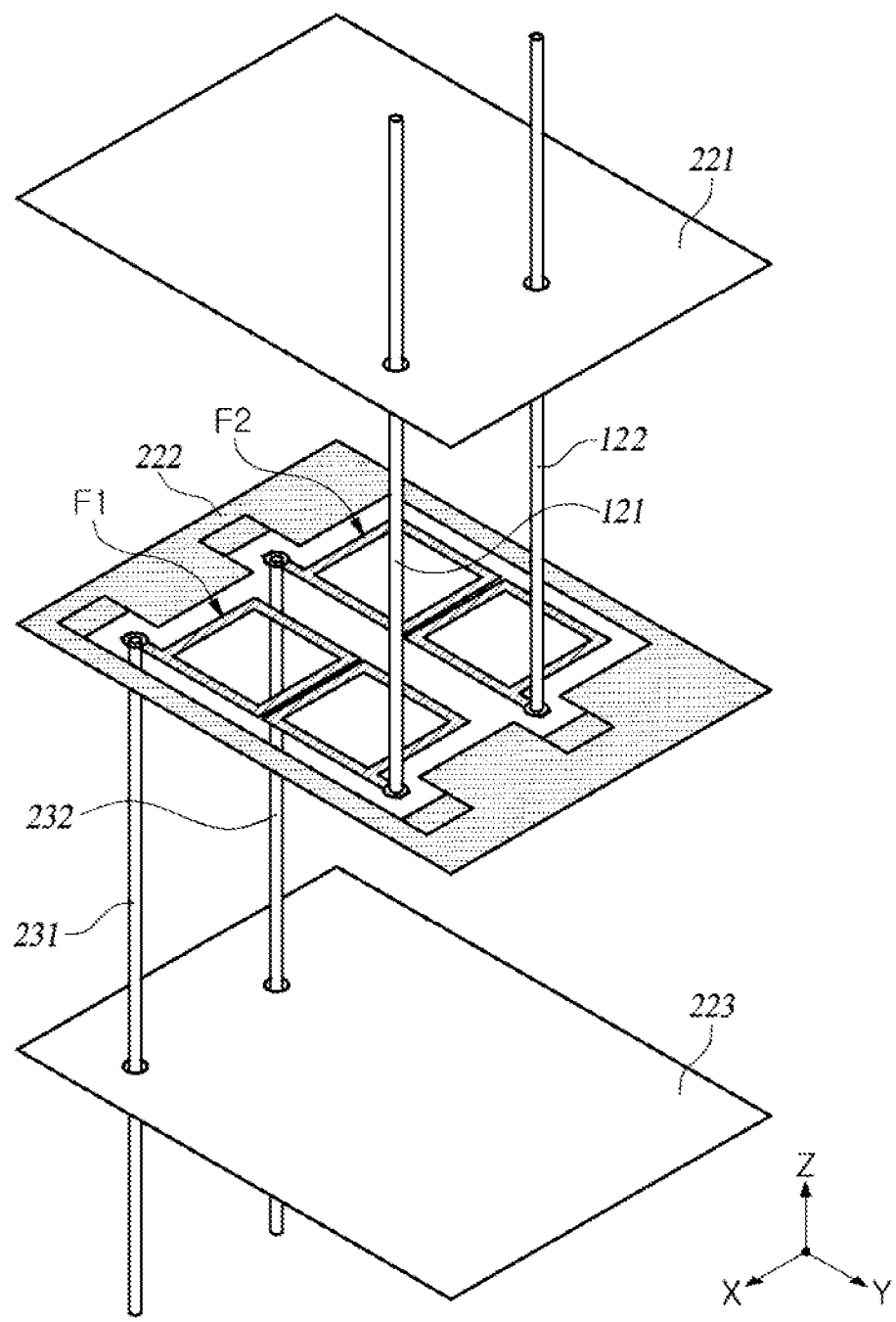
FIGS. 6A and 6B are perspective views illustrating radio frequency filter patterns of a radio frequency filter module, according to examples.
Figure 6B:
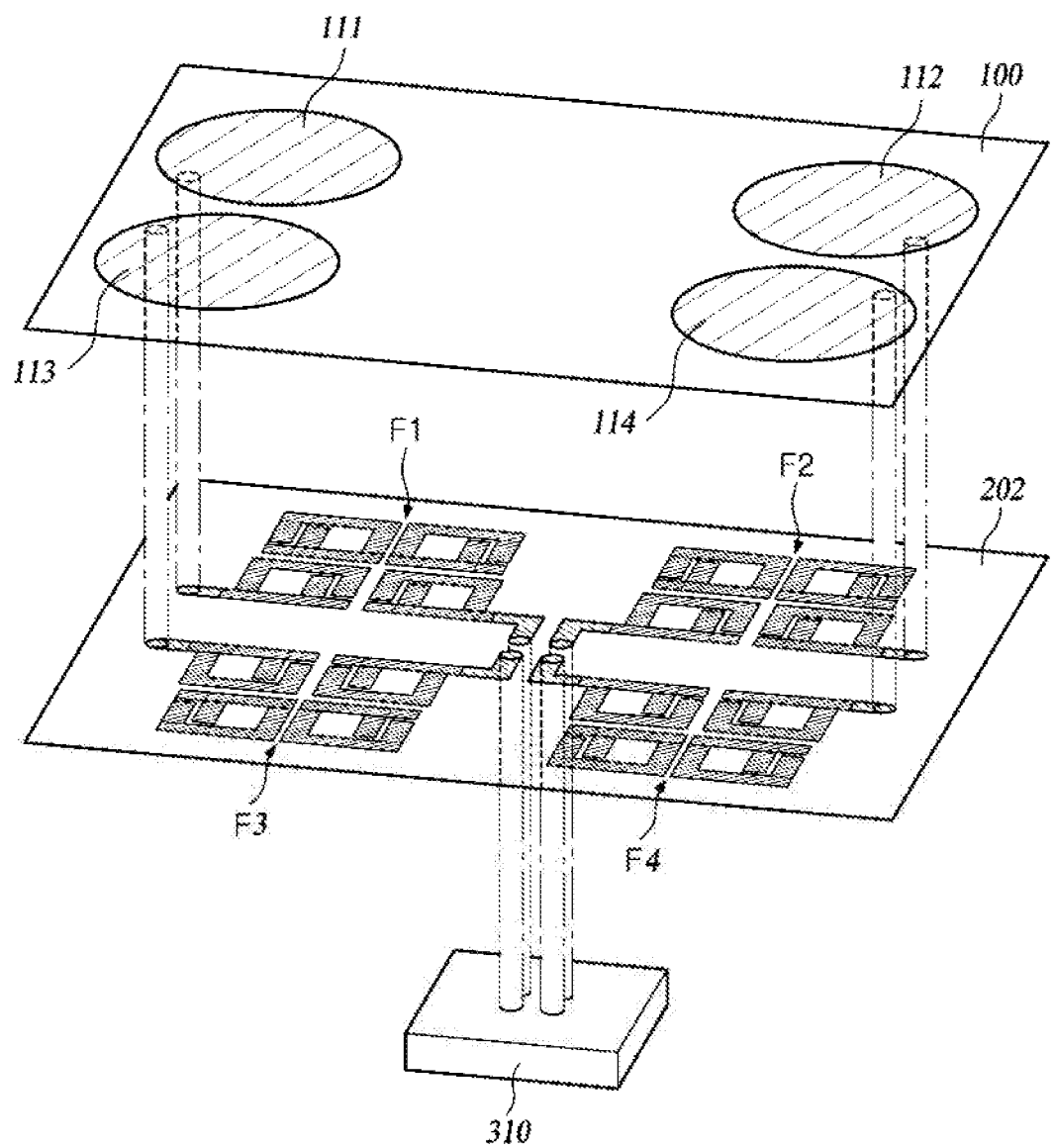

FIGS. 6A and 6B are perspective views illustrating first and second radio frequency filter patterns F1 and F2 of radio frequency filter modules, according to examples.

Referring to FIGS. 6A and 6B, the shapes of the first and second radio frequency filter patterns F1 and F2 are not limited to the shapes and arrangements illustrated in FIGS. 5A to 5D.

Figure 7A:
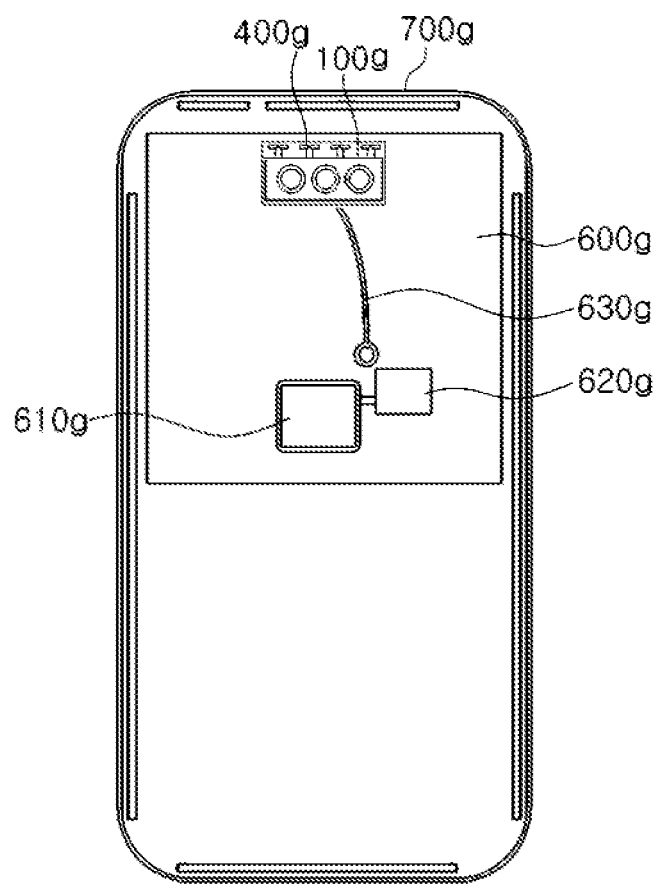
FIGS. 7A and 7B are plan views illustrating arrangements of radio frequency filter modules in electronic devices, according to examples.
Figure 7B:
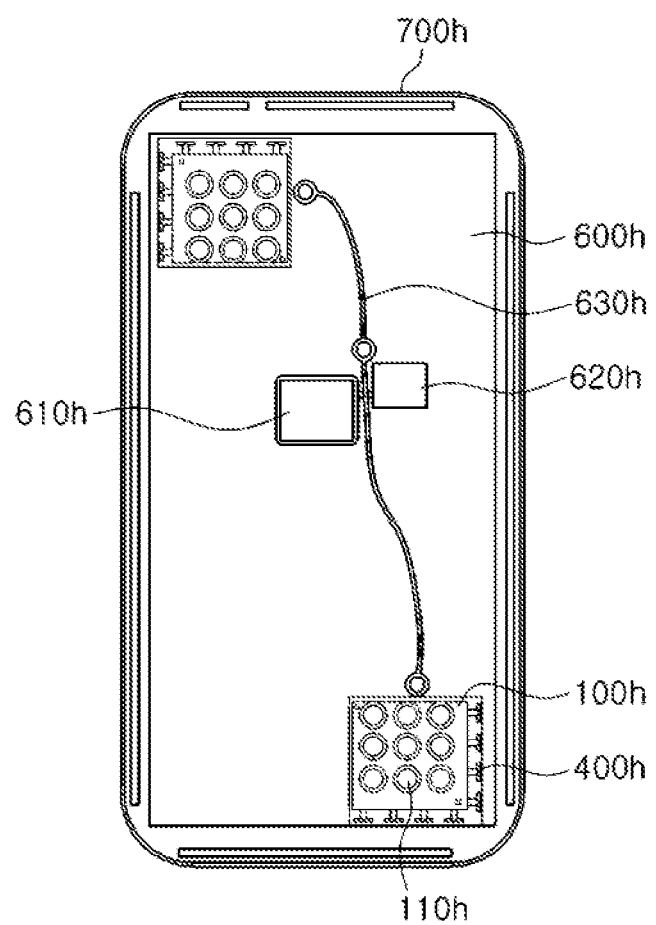

FIGS. 7A and 7B are plan views illustrating arrangements of radio frequency filter modules in electronic devices 700g and 700h, respectively, according to examples.

Referring to FIG. 7A, a radio frequency filter module including an antenna package 100g and an endfire antenna 400g may be disposed on a set substrate 600g, and may be disposed in the electronic device 700g.

The endfire antenna 400g may remotely transmit/receive RF signals in a direction different from a direction in which the antenna package 100g transmits and receives RF signals. For example, the endfire antenna 400g may have the structure of a dipole antenna, a monopole antenna, or a chip antenna.

The electronic device 700g may be a smartphone, a personal digital assistant, a digital video camera, a digital still camera, a network system, a computer, a monitor, a tablet PC, a laptop computer, a netbook, a television set, a video game, a smartwatch, an automobile, or the like, but is not limited to these examples.

A communication module 610g and a second IC 620g may be further disposed on the set substrate 600g. The radio frequency filter module may be electrically connected to the communication module 610g and/or the second IC 620g through a coaxial cable 630g.

The communication module 610g may include at least a portion of a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like, to perform digital signal processing.

The second IC 620g may perform analog-to-digital conversion, amplification of an analog signal, filtering, and frequency conversion to generate a base signal. The base signal input and output through the second IC 620g may be transmitted to the radio frequency filter module through a coaxial cable. For example, when the base signal is an IF signal, the second IC 620g may be implemented as an Intermediate Frequency Integrated Circuit (IFIC). When the base signal is a baseband signal, the second IC 620g may be implemented as a Base Band Integrated Circuit (BBIC).

For example, the base signal may be transmitted to the IC through an electrical connection structure, a core via, and a circuit wiring. The IC may convert the base signal into an RF signal in a millimeter wave (mmWave) band.

Referring to FIG. 7B, a plurality of radio frequency filter modules each including an antenna package 100h, a patch antenna 110h and an endfire antenna 400h may be disposed to be adjacent to a boundary of one side surface and a boundary of another side surface of the electronic device 700h, on a set substrate 600h of the electronic device 700h. A communication module 610h and a second IC 620h may be further disposed on the set substrate 600h. The plurality of radio frequency filter modules may be electrically connected to the communication module 610h and/or the second IC 620h through a coaxial cable 630h.

The patterns, port, via, structure, and plane disclosed in this specification may include a metal material, for example, a conductive material, such as copper (Cu), aluminum (Al), silver (Ag), tin (Sn), gold (Au), nickel (Ni), lead (Pb), titanium (Ti), or alloys thereof, and may be formed depending on a plating method, such as chemical vapor deposition (CVD), physical vapor deposition (PVD), sputtering, subtractive, additive, a semi-additive process (SAP), a modified semi-additive process (MSAP), or the like, but the disclosure is not limited to these examples.

On the other hand, the dielectric layer and the insulating layer disclosed in this specification may also be implemented by FR4, Liquid Crystal Polymer (LCP), Low Temperature Co-fired Ceramic (LTCC), a thermosetting resin such as epoxy resin, a thermoplastic resin such as polyimide, or a resin formed by impregnating these resins in a core material such as a glass fiber, a glass cloth, a glass fabric, or the like, together with an inorganic filler, for example, a prepreg resin, Ajinomoto Build-up Film (ABF) resin, FR-4 resin, Bismaleimide Triazine (BT) resin, a photoimageable dielectric (PID) resin, a copper clad laminate (CCL), an insulating material of glass or ceramic series, or the like.

The RF signals described in this specification may be used in various communications protocols such as Wi-Fi (IEEE 802.11 family or the like), WiMAX (IEEE 802.16 family or the like), IEEE 802.20, Long Term Evolution (LTE), Ev-DO, HSPA+, HSDPA+, HSUPA+, EDGE, GSM, GPS, GPRS, CDMA, TDMA, DECT, Bluetooth, 3rd Generation (3G), 4G, 5G and various wireless and wired protocols designated thereafter, but is the RF signals are not limited to these examples.

As set forth above, a radio frequency filter module according to examples may provide at least two frequency passbands without sacrificing antenna performance, for example, a gain, bandwidth, directivity, or the like, or an overall size of the radio frequency filter module.

The communication modules 610g and 610h in FIGS. 7A and 7B that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency filter module, comprising:
an antenna package comprising patch antennas and having first and second frequency passbands different from each other;
an integrated circuit (IC) package comprising an IC; and
a connecting member disposed between the antenna package and the IC package, and having a laminated structure configured to electrically connect the patch antennas and the IC to each other,
wherein the connecting member comprises:
a first radio frequency filter pattern having the first and second frequency passbands, and comprising a first port electrically connected to the IC and a second port electrically connected to at least one of the patch antennas; and
a second radio frequency filter pattern having the first and second frequency passbands, and comprising a third port electrically connected to the IC and a fourth port electrically connected to at least another one of the patch antennas.

2. The radio frequency filter module of claim 1, wherein the connecting member further comprises:
a first filter layer in which either one or both of the first and second radio frequency filter patterns is disposed; and
a first ground layer disposed between the first filter layer and the antenna package.

3. The radio frequency filter module of claim 2, wherein the connection member further comprises:
a second filter layer disposed between the first filter layer and the IC; and
a second ground layer disposed between the first filter layer and the second filter layer, and
wherein a radio frequency filter pattern that is different from a radio frequency filter pattern disposed in the first filter layer, among the first and second radio frequency filter patterns, is disposed in the second filter layer.

4. The radio frequency filter module of claim 1, wherein the first radio frequency filter pattern has a first bandwidth, and
wherein the second radio frequency filter pattern has a second bandwidth that is wider or narrower than the first bandwidth.

5. The radio frequency filter module of claim 4, wherein the first and second radio frequency filter patterns are electrically connected to each other in series.

6. The radio frequency filter module of claim 1, wherein the first radio frequency filter pattern comprises:
a first ring-shaped pattern comprising a first portion and a second portion;
a first extension pattern extending from the first port in a first direction along the first portion; and
a second extension pattern extending from the second port in a direction different from the first direction along the second portion.

7. The radio frequency filter module of claim 6, wherein the first ring-shaped pattern further comprises:
third and fourth portions positioned between the first and second portions, respectively, and having a shape detouring inwardly.

8. The radio frequency filter module of claim 7, wherein a width of each of the third and fourth portions is greater than a width of each of the first and second portions.

9. The radio frequency filter module of claim 1, wherein the second radio frequency filter pattern comprises:
first, second, third, and fourth ring-shaped patterns;
a first extension pattern extending from the third port in a first direction along a portion of the first and second ring-shaped patterns; and
a second extension pattern extending from the fourth port in a direction different from the first direction along a portion of the third and fourth ring-shaped patterns.

10. The radio frequency filter module of claim 9, wherein the first, second, third, and fourth ring-shaped patterns comprise first, second, third, and fourth inwardly extending portions, respectively, and
wherein extension lengths of the first and third inwardly extending portions are different from extension lengths of the second and fourth inwardly extending portions.

11. The radio frequency filter module of claim 1, wherein the antenna package further comprises:

feed vias electrically connecting the patch antennas to the connecting member, respectively; and a coupling structure respectively surrounding the patch antennas, and wherein the patch antennas comprise:

patch antenna patterns electrically connected to the feed vias, respectively; and coupling patch patterns spaced apart from the patch antenna patterns, respectively.

12. The radio frequency filter module of claim 1, wherein the IC package further comprises:

a core member surrounding the IC and including a core via;

a first electrical connection structure electrically connecting one end of the core via and the connecting member to each other;

a second electrical connection structure electrically connected to another end of the core via; and an encapsulant sealing at least a portion of the IC.

13. The radio frequency filter module of claim 1, wherein the patch antennas comprise first and third patch antenna patterns having the first frequency passband, and second and fourth patch antenna patterns having the second frequency passband, wherein the first radio frequency filter pattern is electrically connected to the first and second patch antenna patterns, and wherein the second radio frequency filter pattern is electrically connected to the third and fourth patch antenna patterns.

14. A radio frequency filter module, comprising:

an antenna package comprising patch antennas;

an IC package comprising an IC; and a connecting member disposed between the antenna package and the IC package, and having a laminated structure configured to electrically connect the patch antennas and the IC to each other, wherein the connecting member comprises:

a first filter layer in which either one of a first radio frequency filter pattern and a second radio frequency filter pattern is disposed;

a first ground layer disposed between the first filter layer and the antenna package;

a second filter layer in which another one of the first radio frequency filter pattern and the second radio frequency filter pattern is disposed; and a second ground layer disposed between the first filter layer and the second filter layer, and wherein the first radio frequency filter pattern comprises:

a first ring-shaped pattern comprising a first portion and a second portion;

a first extension pattern extending from a first port electrically connected to the IC, in a first direction, along the first portion; and a second extension pattern extending from a second port electrically connected to at least one of the patch antennas, in a direction different from the first direction, along the second portion.

15. The radio frequency filter module of claim 14, wherein the first ring-shaped pattern further comprises:

third and fourth portions located between the first and second portions, respectively, the third and fourth portions each having a width greater than a width of each of the first and second portions.

16. The radio frequency filter module of claim 15, wherein the third and fourth portions each have a shape detouring inward.

17. The radio frequency filter module of claim 14, wherein the first radio frequency filter pattern has a first bandwidth, and wherein the second radio frequency filter pattern has a second bandwidth that is wider or narrower than the first bandwidth.

18. The radio frequency filter module of claim 14, wherein the second radio frequency filter pattern comprises:

second, third, fourth, and fifth ring-shaped patterns;

a third extension pattern extending from the third port in a second direction along a portion of the second and third ring-shaped patterns; and a fourth extension pattern extending from the fourth port in a direction different from the second direction along a portion of the fourth and fifth ring-shaped patterns.

19. The radio frequency filter module of claim 18, wherein the second, third, fourth and fifth ring-shaped patterns comprise second, third, fourth and fifth inwardly extending portions, respectively, and wherein the third and fifth inwardly extending portions have a number of bends that is at least one more than a number of bends in the second and fourth inwardly extending portions.

* * * * *